United States Patent [19]
Ahn et al.

[11] Patent Number: 5,691,878
[45] Date of Patent: Nov. 25, 1997

[54] SNAP-LOCKABLE HOUSING FOR FLUORESCENT LAMP BALLASTS

[75] Inventors: Youngkee Ahn; Jiri Slaby, both of Buffalo Grove, Ill.

[73] Assignee: Motorola, Inc., Schaumburg, Ill.

[21] Appl. No.: 594,677

[22] Filed: Feb. 2, 1996

[51] Int. Cl.$^6$ ............................................. H05K 5/00
[52] U.S. Cl. ....................... 361/674; 174/DIG. 2; 220/324; 336/90
[58] Field of Search ........................... 362/190, 194, 362/217, 221, 261, 265; 174/51, 59, 52.1, DIG. 2; 220/315, 4.02, 324, 780; 336/90; 315/238, 276, 278, 291; 361/641, 658, 674, 736, 752, 756

[56] References Cited

U.S. PATENT DOCUMENTS

| | | | |
|---|---|---|---|
| 4,451,693 | 5/1984 | Vest | 174/52 R |
| 4,803,586 | 2/1989 | Tabor | 361/18 |
| 4,901,882 | 2/1990 | Goncalves | 220/324 |
| 5,109,981 | 5/1992 | Matson, III | 206/331 |
| 5,134,548 | 7/1992 | Turner | 362/29 |
| 5,142,458 | 8/1992 | Brunson | 362/194 |
| 5,373,104 | 12/1994 | Brauer | 361/736 |

FOREIGN PATENT DOCUMENTS 728824  2/1966  Canada ........................ 174/DIG. 2

Primary Examiner—Gerald P. Tolin
Attorney, Agent, or Firm—Gary J. Cunningham; Kenneth L. Labudda

[57] ABSTRACT

A housing for use with a ballast for powering one or more fluorescent lamps. In a preferred embodiment, the housing includes a cover (48) and a base (10). The cover (48) has at least two fingers (80), where each finger (80) includes a mating portion (86). The base (10) has at least two corresponding finger ports (100), each with a guide-lock structure (102) for guiding insertion of the mating portion (86) of the finger (80) into the finger port (100) and for securely locking the finger (80) in place when the mating portion (86) is inserted into the finger port (100).

18 Claims, 3 Drawing Sheets

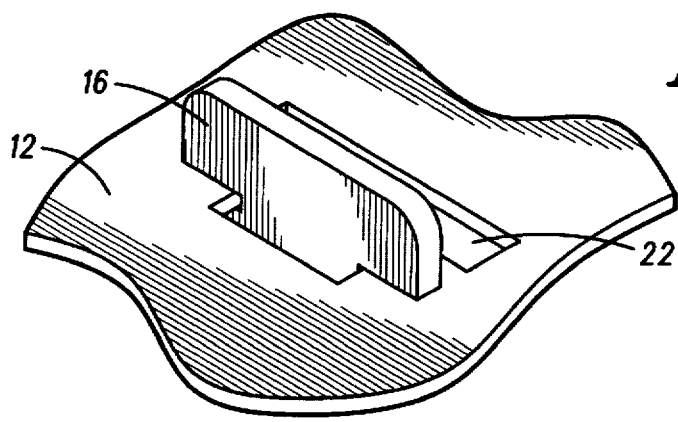
FIG. 2
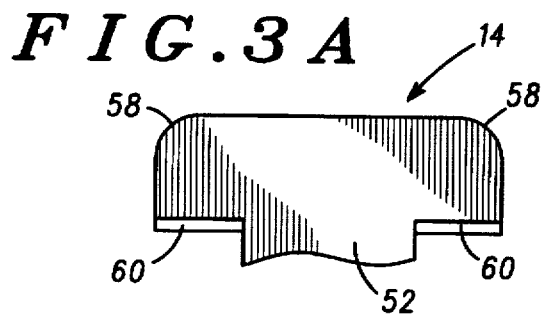
FIG. 3A
FIG. 3B
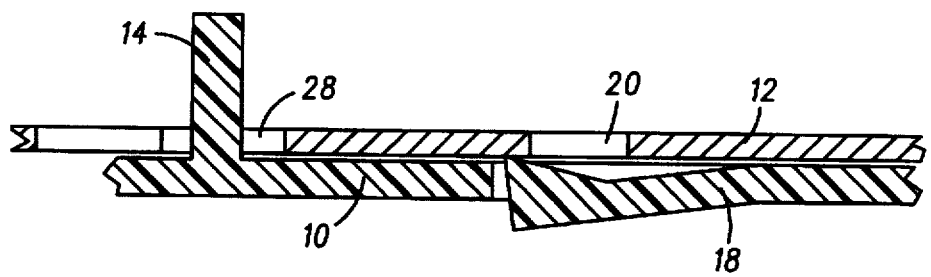
FIG. 4
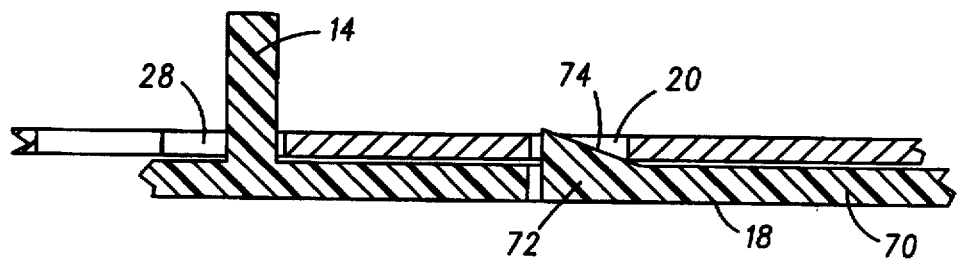
FIG. 5

SNAP-LOCKABLE HOUSING FOR FLUORESCENT LAMP BALLASTS

FIELD OF THE INVENTION

The present invention relates to the general subject of housings and, in particular, to a snap-lockable housing for fluorescent lamp ballasts.

BACKGROUND OF THE INVENTION

One of the necessary steps in the manufacture or retrofit of fluorescent lighting systems is the installation and/or removal of a ballast in a lighting fixture or junction box. Typically, ballast installation involves two distinct tasks—electrical wiring and physical mounting of the ballast package.

Existing methods for mounting a ballast within a lighting fixture or junction box include the simple "hardware" approach, in which the ballast package contains flanges on opposing ends and the ballast is mounted to the fixture using simple screws or nuts and bolts, and the "snap-on" method, in which the base of the ballast enclosure contains small projections which snap into holes in the fixture or junction box. The hardware approach is undesirable due to the amount of time and effort, as well as the additional hardware and tools, that are required. The snap-on method, while much less labor intensive than the hardware approach and quite attractive due to its simplicity and apparent elimination of the need for additional hardware or tools, has proven to be highly unreliable from a mechanical standpoint and is not at all amenable to repeated installation and removal of the same ballast.

It is therefore apparent that a ballast mounting which eliminates the need for additional hardware and tools, which minimizes the time and effort required for installation and removal, and which provides a reliable, secure, and repeatable mounting of the ballast package, would constitute a considerable improvement over the prior art.

One of the necessary steps in the manufacture of fluorescent lamp ballasts is final assembly of the ballast, in which the ballast circuit is enclosed and sealed within a protective housing. This task typically consists of first mounting the ballast circuit board within a base and then attaching a cover to the base.

Existing methods for attaching the cover and base include simple riveting, which is used almost universally in the case of metal housings, and ultrasonic welding, which is widely employed for plastic housings. Both methods provide a secure and, for all practical purposes, permanent physical connection between the cover and the base, but at the considerable cost of specialized equipment.

An attractive alternative is a snap-fittable housing in which the cover and the base "snap" together. This allows for manual assembly and thus eliminates the need for specialized equipment. Furthermore, a snap-fittable housing may be designed to be reusable, insofar as disassembly is not destructive to the housing. Non-destructive disassembly allows for the option of subsequent repair of the ballast on a component level. However, design of a reusable snap-fittable housing for manual assembly which provides a truly secure and protective package for the ballast circuit board and components, particularly under extreme conditions such as drop-shock and vibration, is not a trivial task. It is therefore apparent that a ballast housing which is designed for easy manual assembly, which is reusable, and which provides as secure and protective a package for ballast components as existing methods would constitute a significant improvement over the prior art.

BRIEF DESCRIPTION OF THE DRAWINGS

FIG. 2 shows a key of the base inserted into a key port of the back plate, in accordance with the present invention.

FIG. 3A shows a front-view of a key, and FIG. 3B shows a left-side view of the key, in accordance with the present invention.

FIG. 4 shows a left-side view of a lock structure prior to interconnection of a male member of the base with a female member of the back plate, in accordance with the present invention.

FIG. 5 shows a left-side view of the lock structure shown in a locked position interconnecting a male member of the base with a female member of the back plate, in accordance with the present invention.

DETAILED DESCRIPTION OF THE PREFERRED EMBODIMENT

Figure 1:
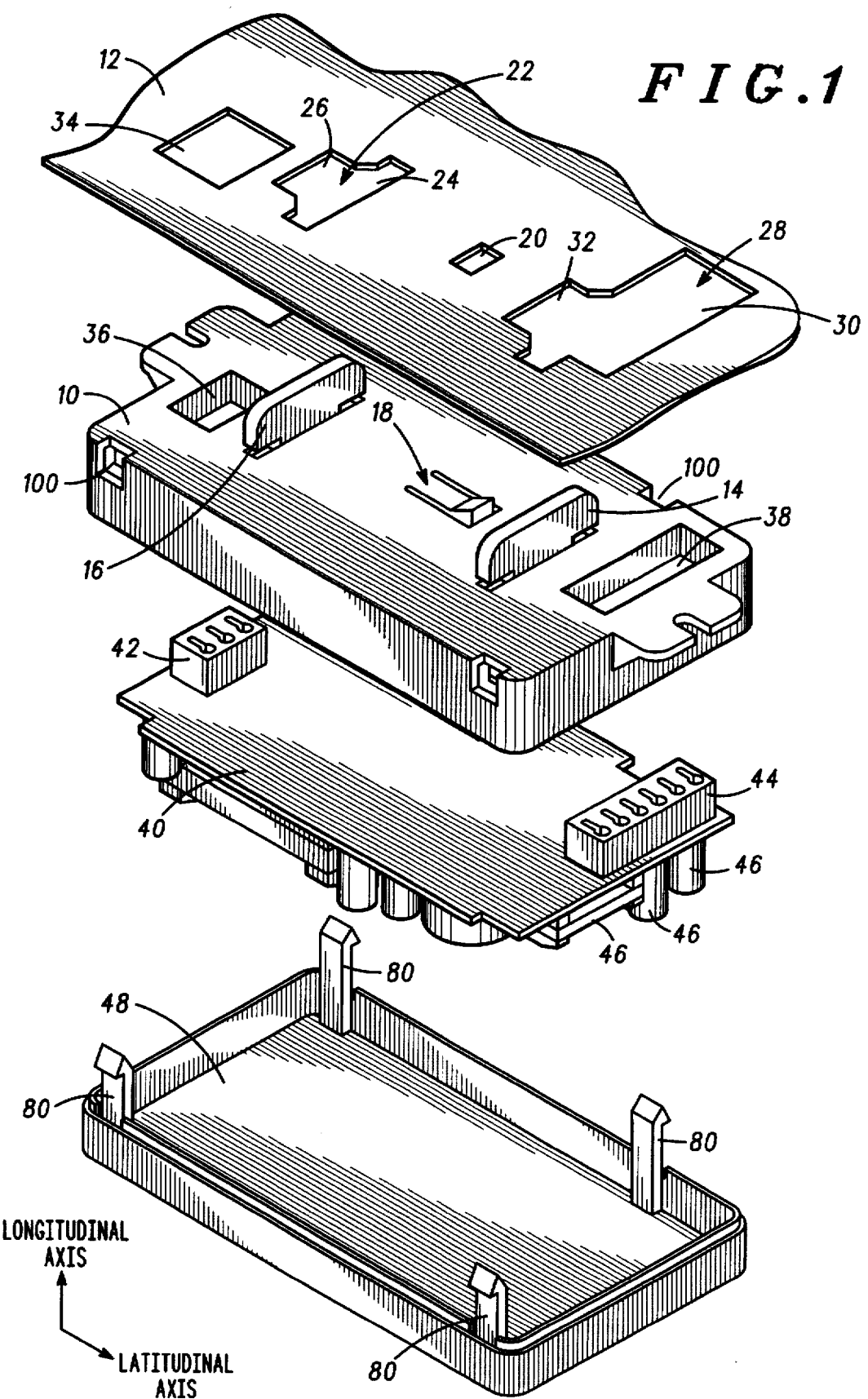
FIG. 1 is an exploded elevational view of a ballast mounting comprising a back plate, a base, a populated circuit board, and a cover, in accordance with the present invention.

A ballast mounting is shown in FIG. 1. In its most basic form, the ballast mounting comprises a base 10, a back plate 12, and a lock structure for locking the base 10 to the back plate 12. The base 10 has at least one key 16 that extends away from the base 10, and the back plate 12 has at least one key port 22 that is adapted to receive the key 16 and that is configured to allow the key 16 to be positionally adjusted with regard to the back plate 12. As the back plate 12 is attached to a lighting fixture or junction box prior to ballast installation, this mounting allows one to quickly, reliably, and securely mount a ballast to an appropriate fixture without the need for tools or hardware.

In a preferred embodiment substantially as shown in FIG. 1, the base 10 has two keys 14, 16 that are rigidly connected to the base 10, and the back plate 12 has two key ports 28, 22. The mounting also includes a cover 48 that is adapted to be securely connected to the base 10, the base 10 and the cover 48 together defining a housing that is adapted to receive a circuit board 40. The circuit board 40 is populated with electrical components 46 that are operable to drive at least one fluorescent lamp. The circuit board 40 also contains an input connector 42 and an output connector 44, and the base 10 and the back plate 12 each include an input connector port and an output connector port. Specifically, the base 10 includes a base input connector port 36 and a base output connector port 38, and the back plate 12 includes a back plate input connector port 34 and, although not explicitly identified in the figures, a back plate output connector port. Note that, in the embodiment described by FIG. 1, the back plate output connector port does not exist as a separate entity but is integrated with key port 28. Back plate input connector port 34 and key port 28 are oversized to accommodate the input connector 42 and output connector 44 while at the same time allowing for positional adjustment of the base 10 and the keys 14, 16 with regard to the back plate 12.

The insertion and positioning of each key 14, 16 with regard to its corresponding key port 26, 28 is illustrated in FIG. 2. Referring back to FIG. 1, key port 22 comprises a first portion 24 configured to receive key 16, and a second portion 26 configured to retain key 16. As shown in FIGS. 3A and 3B, key 14 includes a neck portion 52, chamfered outer portions 58 for facilitating insertion into key port 22, and inclined surfaces 60 for facilitating a sliding motion by which key 14 is positionally adjusted with respect to back plate 12.

In a preferred embodiment, the lock structure comprises a male member 18 of the base and a female member 20 of the back plate. As shown in FIGS. 4 and 5, the male member 18 interconnects with the female member 20 when the base 10 is suitably positioned with respect to the back plate 12. In order to accommodate the moderate latitudinal deformation which occurs prior to interconnection with the female member 20, the male member 18 is latitudinally flexible with respect to the base 10, as shown in FIG. 4. The male member 18 includes a longitudinally extending portion 70 that is substantially parallel to a surface of the base 10, and terminates with a latitudinally extending portion 72 that is substantially perpendicular to the surface of the base 10. The latitudinally extending portion 72 includes a sloped portion 74 which facilitates a sliding motion prior to interconnection with the female member 20.

Referring again to FIG. 1, the assembled ballast comprises the circuit board 40, the base 10, and the cover 48. Circuit board 40 is populated with electrical components 46, as well as input connector 42 and output connector 44. The base 10, back plate 12, and cover 48 may be composed of any of a variety of materials, including metals and plastics. In one embodiment, the base 10 and cover 48 are composed of a molded plastic material, while the back plate 12 is composed of galvanized steel.

The back plate 12 is mounted to a fluorescent lighting fixture or junction box, either as part of the fixture or junction box manufacturing process or at any point prior to ballast installation. The assembled ballast is then securely attached to the fixture-mounted back plate 12 as follows. The ballast is moved latitudinally such that keys 14, 16 are fully inserted into the first portions 30, 24 of key ports 28, 26, respectively, at which point further latitudinal movement is prohibited by virtue of a surface of the base 10 butting against a surface of the back plate 12. At the same time, the latitudinally extending portion 72 of the male member 18 of the lock structure is likewise in contact with the surface of back plate 12, causing a temporary latitudinal deformation in the longitudinally extending portion 70. Next, the ballast is slid in a longitudinal direction such that the keys 14, 16 are moved from the first portions 30, 24 into the second portions 32, 26 of key ports 28, 26, respectively. Simultaneously, the latitudinally extending portion 72 of the male member 18 of the lock structure is moved toward the female member 20. Upon completion of the longitudinal sliding motion, further sliding being prohibited by the neck portion 52 of each key 14, 16 butting up against an outside edge of its respective key port, the latitudinally extending portion 72 becomes seated inside of female member 20, as shown in FIG. 5.

In order to dismount the ballast from the back plate 12, one must push down upon the latitudinally extending member 72, which results once again in a latitudinal deformation in the longitudinally extending portion 70. Simultaneously, while pushing down upon member 72, the ballast must be slid in a longitudinal direction such that the keys 14, 16 are moved from the second portions 32, 26 into the first portions 30, 24 of key pods 28, 26, respectively. This being done, all that remains in the dismounting process is to move the ballast in a latitudinal direction such that the keys 14, 16 are entirely removed from key ports 28, 26.

The disclosed ballast mounting offers several advantages over existing practices for ballast installation and replacement. First of all, as the back plate is attached to the fixture beforehand, and the base and back plate are designed to mate with each other, no additional hardware or special tools are required in order to securely mount the ballast inside of the fixture. This greatly reduces the time and effort involved in ballast installation or replacement. Furthermore, the disclosed combination of keys and a locking structure provides for a very reliable and secure ballast mounting which is very easy to properly install and which is highly resistant to failures which might arise due to drop shock, vibration, or repeated installation and removal of the same ballast.

A preferred embodiment of a snap-lockable housing is described with reference to FIGS. 1, 6A, 6B, 6C, and 6D. Referring to FIG. 1, the ballast housing comprises a first assembly and a second assembly which, in a preferred embodiment, respectively correspond to a cover 48 and a base 10 which are adapted to be securely connected to each other and are configured to receive a circuit board 40 populated with components 46 for driving at least one fluorescent lamp. The base 10 also includes an input connector port 36 and an output connector port 38 for accommodating, respectively, a ballast input connector 42 and output connector 44.

In a preferred embodiment, the cover 48 includes four fingers that are latitudinally flexible, each finger 80 having a mating portion 86, and the base 10 includes four corresponding finger ports 100. Each finger port 100 and finger 80 are complementarily configured to receive the mating portion 86 of the finger 80 into the finger port 100. In one embodiment, each finger 80 includes a longitudinally extending member 82 and an end portion 84, the end portion 84 including the mating portion 86, as well as a first sloped portion 88 and a second sloped portion 90 for facilitating insertion of the mating portion 86 into the finger port 100.

Figure 6A:
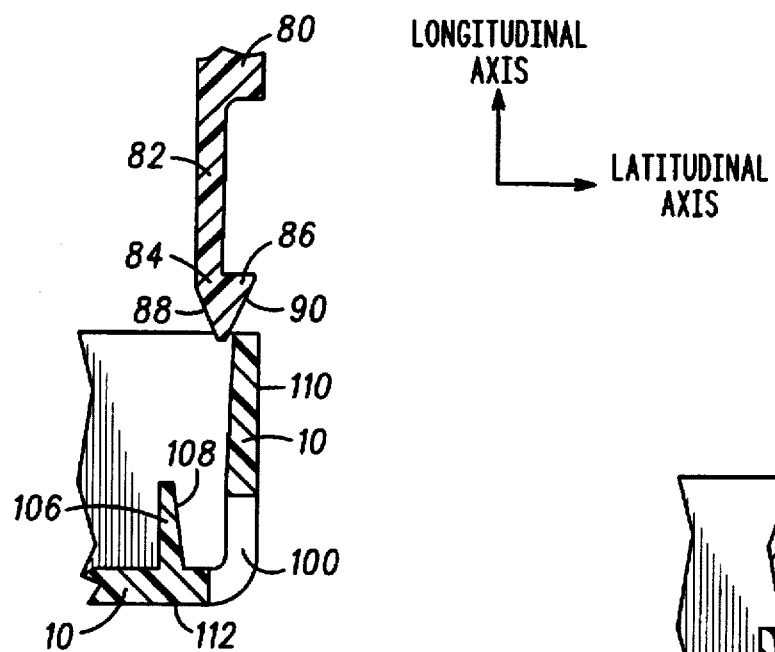
FIGS. 6A, 6B, 6C, and 6D illustrate the insertion and locking of a finger into a finger port, in accordance with the present invention.

The base 10 also includes four guide-lock structures for guiding insertion of the mating portion 86 into the finger port 100 and for securely locking the finger 80 in place when the mating portion 86 is inserted into the finger port 100. In one embodiment, substantially as shown in FIG. 6A, each guide-lock structure comprises a tab 106 that is latitudinally flexible and is located adjacent to the finger port 100. The tab includes a longitudinally sloped surface 108 for facilitating insertion of the mating portion 86 of the finger 80 into the finger port 100.

In one embodiment, the mating portion 86 of the finger 80 has a wedged shape, as shown in FIGS. 1 and 6A. Correspondingly, the finger port 100 has a substantially rectangular shape, a portion of which is located along a longitudinal surface 110 of the base 10. Another portion of the finger port 100 is located along a latitudinal surface 112 of the base 10.

Figure 6B:
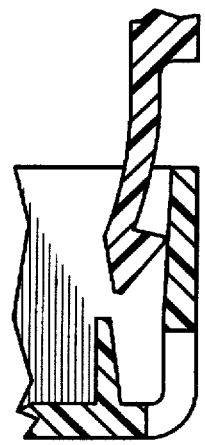
Figure 6C:
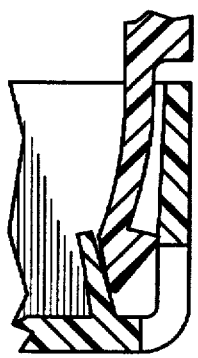
Figure 6D:
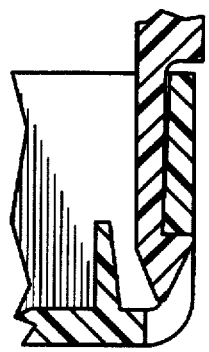

The housing assembly process is illustrated in detail in FIGS. 6B, 6C, and 6D. As shown in FIG. 6B, the finger 80 becomes temporarily latitudinally deformed prior to insertion of the mating portion 86 into the finger port 100. FIG. 6C shows the temporary latitudinal deformation which occurs when the first sloped portion 88 of the finger 80 comes in contact with the longitudinally sloped surface 108 of the tab 106. Finally, as shown in FIG. 6D, both the finger 80 and the tab 106 cease to be deformed once the mating portion 86 is inserted into the finger port 100.

The first sloped portion 88 and the second sloped portion 90 of the finger 80, along with the sloped surface 108 of the tab 106, serve to significantly enhance the ease of assembly. Subsequently, once the mating portion 86 is inserted into the finger port 100, the wedge shape of the mating portion 86 prevents longitudinal movement of the finger 80, while the presence of tab 106 impedes latitudinal movement of the finger 80. In this way, finger 80 is locked into finger port 100 and the cover 48 and base 10 are thus securely connected to each other.

The forces required for assembly and disassembly of the ballast housing are best explained by reference to tests performed with a prototype plastic housing configured substantially as shown in the drawings. The longitudinally-directed force which was required in order to produce sufficient latitudinal deformation of the finger 80 as shown in FIG. 6B was 3.0 pounds, while that required to produce sufficient latitudinal deformation of the tab 106 as shown in FIG. 6C was 1.5 pounds. Therefore, the highest force which was required at any point in the assembly process was 4.5 pounds for each finger/finger port pair. By contrast, in the disassembly process, a latitudinally-directed force of 6.6 pounds, applied to the mating portion 86, was required in order to unseat the mating portion 86 from the finger port 100. Therefore, the force and effort required for disassembly of the housing considerably exceeds that required for assembly, which is a highly desirable attribute in that it still allows for easy assembly of the housing but enhances the strength and integrity of the physical connection between the base 10 and the cover 48.

The disclosed snap-fittable ballast housing offers several advantages over existing housings. First of all, as the housing is designed for easy manual assembly, no specialized equipment or trained operators are required for assembly. Furthermore, the disclosed finger and guide-lock structures provide a very secure and protective connection between the base and cover which requires considerably more physical force for disassembly than for assembly and remains secure under many extreme conditions such as drop-shock and vibration. Finally, the disclosed housing allows for non-destructive disassembly of the ballast housing, which is very convenient if component-level field repair of the ballast is to be performed.

Although the present invention has been described with reference to a certain preferred embodiment, numerous modifications and variations can be made by those skilled in the art without departing from the novel spirit and scope of this invention. For example, any number of fingers, finger ports, and guide-lock structures may be used. Rather than belonging to the cover 48, the fingers 80 may be part of the base 10, in which case the finger ports 100 would then be included in the cover 48. The general shape of the fingers 80, finger ports 100, and the ballast housing itself may be quite different from those shown in the drawings. For instance, the finger ports 100 need not be limited to a rectangular shape, and are not restricted to being located in the position on the base 10 that is shown in the drawings.

What is claimed is:

1. A ballast housing comprising:
a cover and a base substantially securely connected to each other to define a housing;
the cover having at least two fingers, each finger having a mating portion;
the base having at least two finger ports;
each finger port and finger being substantially complementarily configured and each mating portion of a finger extends into each finger port; and
the base including at least two guide-lock structures which guide insertion of the mating portion of the finger into the finger port and securely lock the finger in place, each guide-lock structure comprising a tab that is substantially latitudinally flexible and that is located adjacent to its corresponding finger port on the base.

2. The housing of claim 1, wherein the base includes an input connector port and an output connector port.

3. The housing of claim 1, wherein the cover includes four fingers and the base includes four finger ports.

4. The housing of claim 1, wherein at least one finger comprises a longitudinally extending member that terminates with an end portion, the end portion including the mating portion.

5. The housing of claim 4, wherein the end portion includes a first sloped portion and a second sloped portion for facilitating insertion of the mating portion of the finger into the finger port.

6. The housing of claim 1, wherein the mating portion of at least one finger has a substantially wedged shape.

7. The housing of claim 1, wherein at least one finger comprises a structure that is substantially latitudinally flexible.

8. The housing of claim 1, wherein at least one finger port is substantially rectangular in shape.

9. The housing of claim 1, wherein each finger port comprises a first portion that is located along a longitudinal surface of the base, and a second portion that is located along a latitudinal surface of the base.

10. The housing of claim 1, wherein the tab includes a substantially longitudinally sloped surface for facilitating insertion of the mating portion of the finger into the finger port.

11. The housing of claim 1, wherein the base and cover are configured to receive a circuit board populated with components operable to drive at least one fluorescent lamp.

12. A ballast housing comprising:
a cover and a base substantially securely connected to each other to define a housing configured to receive a circuit board populated with components operable to drive at least one fluorescent lamp;
the cover having at least two fingers, each finger having a mating portion;
the base having at least two finger ports;
each finger port and finger being substantially complementarily configured and each mating portion of a finger extends into each finger port;
each finger being substantially latitudinally flexible and comprising a longitudinally extending member that terminates with an end portion, the end portion including the mating portion;
each finger port being substantially rectangular in shape; and
the base including at least two guide-lock structures for which guide insertion of the mating portion of each finger into its corresponding finger port and substantially securely lock the finger in place the guide-lock structures each comprising a tab that is substantially latitudinally flexible and that is located adjacent to the finger port, the tab including a substantially longitudinally sloped surface for facilitating insertion of the mating portion of the finger into the finger port.

13. The housing of claim 12, wherein the base includes an input connector port and an output connector port.

14. The housing of claim 12, wherein the cover includes four fingers and the base includes four finger ports.

15. The housing of claim 12, wherein the end portion includes a first sloped portion and a second sloped portion for facilitating insertion of the mating portion of the finger into the finger port.

16. The housing of claim 12, wherein the mating portion of at least one finger has a substantially wedged shape.

17. The housing of claim 12, wherein each finger port comprises a first portion that is located along a longitudinal surface of the base, and a second portion that is located along a latitudinal surface of the base.

18. A ballast housing comprising:

a cover and a base substantially securely connected to each other to define a housing configured to receive a circuit board populated with components operable to drive at least one fluorescent lamp;

the cover having four fingers, each finger having a mating portion, the mating portion having a substantially wedged shape;

the base having four finger ports, an input connector port, and an output connector port;

each finger port and finger being substantially complementarily configured and each mating portion of a the finger extends into each finger port;

each finger being substantially latitudinally flexible and comprising a longitudinally extending member that terminates with an end protion that includes the mating portion, the end portion including a first sloped portion and a second sloped portion facilitating insertion of the mating portion of the finger into the finger port;

each finger port being substantially rectangular in shape; and the base including at least two guide-lock structures which guide insertion of the mating portion of each finger into its corresponding finger port and substantially securely lock the finger in place, each guide-lock structure comprising a tab that is substantially latitudinally flexible and that is located adjacent to the finger port, the tab including a substantially longitudinally sloped surface for facilitating insertion of the mating portion of the finger into the finger port.

\* \* \* \* \*

UNITED STATES PATENT AND TRADEMARK OFFICE
CERTIFICATE OF CORRECTION

PATENT NO. : 5,691,878
DATED : November 25, 1997
INVENTOR(S) : Ahn et al.

It is certified that error appears in the above-indentified patent and that said Letters Patent is hereby corrected as shown below:

In claim 12, col. 6, line 53, it reads " structures for which guide" should be --structures which guide".

In claim 18, col. 7, line 21, it reads "portion of a the finger" should be --portion of a finger--.

In claim 18, col. 8, line 3, the word "protion" should be --portion--.

Signed and Sealed this

Twenty-eighth Day of April, 1998

Attest:

BRUCE LEHMAN

Attesting Officer

Commissioner of Patents and Trademarks